United States Patent
Whittaker

(10) Patent No.: US 10,345,346 B2
(45) Date of Patent: Jul. 9, 2019

(54) RADIO-FREQUENCY VOLTAGE DETECTION

(71) Applicant: SKYWORKS SOLUTIONS, INC., Woburn, MA (US)

(72) Inventor: Edward John Wemyss Whittaker, Bishop's Stortford (GB)

(73) Assignee: Skyworks Solutions, Inc., Woburn, MA (US)

(*) Notice: Subject to any disclaimer, the term of this patent is extended or adjusted under 35 U.S.C. 154(b) by 71 days.

(21) Appl. No.: 15/207,485

(22) Filed: Jul. 11, 2016

(65) Prior Publication Data

US 2017/0023622 A1    Jan. 26, 2017

Related U.S. Application Data

(60) Provisional application No. 62/191,473, filed on Jul. 12, 2015.

(51) Int. Cl.
*G01R 19/04* (2006.01)
*G01R 19/32* (2006.01)

(52) U.S. Cl.
CPC .............. *G01R 19/04* (2013.01); *G01R 19/32* (2013.01)

(58) Field of Classification Search
CPC ........ G01R 19/04; G01R 19/32; G01R 27/04; G06N 3/04; G06N 3/02
USPC .............. 324/600, 500, 629, 760.02, 760.08, 324/760.09, 765.01, 503, 522, 537, 509, 324/545, 546; 361/18, 23, 93.1; 327/334–349, 560–563
See application file for complete search history.

(56) References Cited

U.S. PATENT DOCUMENTS

| | | | |
|---|---|---|---|
| 2003/0042885 A1 | 3/2003 | Zhou et al. | |
| 2007/0030034 A1 | 2/2007 | Kurtman et al. | |
| 2007/0205916 A1* | 9/2007 | Blom | G01K 7/01 340/870.17 |
| 2009/0322379 A1* | 12/2009 | Tomita | G11B 7/1263 327/58 |

FOREIGN PATENT DOCUMENTS

EP    2713171 A2    4/2014

* cited by examiner

*Primary Examiner* — Melissa J Koval
*Assistant Examiner* — Trung Nguyen
(74) *Attorney, Agent, or Firm* — Chang & Hale LLP

(57) ABSTRACT

Methods and apparatus are provided for detection of voltage levels of RF signals. A first voltage correction is provided based on a thermal voltage and a second voltage correction is provided based on a voltage difference between a detection transistor, used for the rectification of the RF signal, and a reference transistor, to which the RF signal is not supplied. Based on the first and second voltage corrections, a more accurate detector with greater linearity may be obtained. In an embodiment, the second voltage correction may be generated proportional to a hyperbolic tangent of the voltage difference between two transistors, obtained using an additional pair of transistors configured as a differential pair. Applications include the control of a power amplifier output in a wireless device.

19 Claims, 8 Drawing Sheets

RADIO-FREQUENCY VOLTAGE DETECTION

CROSS-REFERENCE TO RELATED APPLICATION(S)

This application claims priority to U.S. Provisional Application No. 62/191,473 filed Jul. 12, 2015, entitled RADIO-FREQUENCY VOLTAGE DETECTION, the disclosure of which is hereby expressly incorporated by reference herein in its entirety.

BACKGROUND

Field

The present disclosure relates to detectors of radio-frequency (RF) signals.

Description of the Related Art

In many radio-frequency (RF) applications it is advantageous to be able to detect the power level of a signal. An approach is to detect the envelope of a signal or its peak voltage.

For example, in some applications it is desirable to know the voltage level of a signal outputted from a power amplifier (PA) to provide feedback for controlling the outputted signal level. This may be incorporated into automatic gain control, wherein a feedback control loop adjusts the gain of an amplifier based on the input signal power level so the output signal power level is relatively constant.

An approach proposed by Meyer, R. G. in "Low-power monolithic RF peak detector analysis," IEEE Journal of Solid-State Circuits, vol. 30, no. 1, pp. 65,67, January 1995, the entire contents being hereby incorporated by reference, makes use of a first bipolar transistor as rectifying element and a second bipolar transistor to set up an offsetting dc voltage. A circuit according to this approach is shown in FIG. 1. Meyer presents an analysis for large square-wave input signals that relates the detected voltage to the input signal peak voltage plus an error term represented by $V_T \ln(2)$, in which $V_T$ is the thermal voltage given by $k_B T/q$, in which q is the magnitude of the electrical charge of an electron, $k_B$ is the Boltzmann constant and T is the absolute temperature, $V_T$ having a value of approximately 25 mV at room temperature. It is further disclosed that the $V_T$-dependent error term can be cancelled by doubling the current in the second transistor relative to the first transistor. As the derived error term is only an approximation to the true error in a detector, practical implementations of this approach do not provide an exact measurement of the voltage level of the input signal, particularly for low voltage levels, having a non-linear response to the voltage level of the input signal.

Therefore it would be desirable to provide a detector with improved accuracy and/or linearity. It would further be desirable to provide such a detector without greatly increasing the complexity, size or cost of the detector.

SUMMARY

In general, circuits, applications and methods are described for detecting a voltage level of an RF signal.

In accordance with some implementations, the present disclosure relates to a detector circuit for determining a peak voltage level of an RF signal, the detector circuit comprising a detection transistor configured to receive the RF signal, and voltage correction circuitry configured to generate a first voltage correction based on the thermal voltage and a second voltage correction based on a voltage difference between the detection transistor and a reference transistor that is not configured to receive the RF signal.

In some embodiments, the second voltage correction is based on a voltage difference that is obtained without taking into account the first voltage correction. In some embodiments, the second voltage correction is based on a voltage difference between an emitter of the detection transistor and an emitter of the reference transistor. In some embodiments, the second voltage correction is based on a voltage difference between an emitter of the detection transistor and an emitter of the reference transistor.

In some embodiments, the second voltage correction increases with increasing voltage difference from zero up to a threshold and does not increase or increases at a lower rate with increasing voltage difference above the threshold. In some embodiments, the threshold is a soft threshold.

In some embodiments, the second voltage correction is based on a sigmoid function of the voltage difference. In some embodiments, the second voltage correction is based on a hyperbolic tangent of the voltage difference divided by twice the thermal voltage.

In some embodiments, the detector circuit comprises first and second reference transistors that are not configured to receive the RF signal, and the second voltage correction is based on a voltage difference between the detection transistor and the second reference transistor.

In some embodiments, the first voltage correction is $V_T \ln(2)$.

In some embodiments, the correction circuitry includes a differential pair of transistors for generating the second correction voltage. In some embodiments, the voltage inputs of the differential pair of transistors are coupled to the emitters of the detection transistor and the second reference transistor. In some embodiments, the correction circuitry is configured to produce, using the differential pair of transistors, the second correction voltage based on hyperbolic tangent of a voltage difference between the detection transistor and the second reference transistor.

In some embodiments, the differential pair of transistors includes two emitter-coupled bipolar transistors or two source-coupled field-effect transistors. In some embodiments, the correction circuitry includes at least one current mirror stage to mirror the difference in collector or drain currents of the differential pair to the first reference transistor for generation of the second correction voltage.

In some embodiments, the differential pair of transistors includes two emitter-coupled bipolar transistors. In some embodiments, the detector circuit includes a low-pass RC filter located between the emitter of the reference transistor and the base of a first transistor of the differential pair, and a matching resistor between the emitter of the second reference transistor and the base of the second transistor of the differential pair.

In some embodiments, the differential pair of transistors is connected to a proportional-to-absolute-temperature current source. In some embodiments, the detection transistor and the first and second reference transistors are connected to proportional-to-absolute-temperature current sources.

In some embodiments, the detection transistor and the first and second reference transistors are NPN bipolar transistors, the RF input being provided to the base of the detection transistor.

In some embodiments, the detector circuit includes a bypass capacitor coupled to a location between the base of the detection transistor and the bases of the first and second reference transistors.

In accordance with some implementations, the present disclosure relates to a semiconductor die comprising at least one detector circuit for determining a peak voltage level of a radio-frequency (RF) signal, the detector circuit comprising a detection transistor configured to receive the RF signal, and voltage correction circuitry configured to generate a first voltage correction based on the thermal voltage and a second voltage correction based on a voltage difference between the detection transistor and a reference transistor that is not configured to receive the RF signal.

In accordance with some implementations, the present disclosure relates to an RF module comprising at least one semiconductor die comprising at least one detector circuit for determining a peak voltage level of an RF signal, the detector circuit comprising a detection transistor configured to receive the RF signal, and voltage correction circuitry configured to generate a first voltage correction based on the thermal voltage and a second voltage correction based on a voltage difference between the detection transistor and a reference transistor that is not configured to receive the RF signal.

In accordance with some implementations, the present disclosure relates to a wireless device comprising at least one RF module comprising at least one semiconductor die comprising at least one detector circuit. In these implementations, the at least on semiconductor die comprises the detector circuit for determining a peak voltage level of an RF signal, the detector circuit comprising a detection transistor configured to receive the RF signal, and voltage correction circuitry configured to generate a first voltage correction based on the thermal voltage and a second voltage correction based on a voltage difference between the detection transistor and a reference transistor that is not configured to receive the RF signal.

In accordance with some implementations, the present disclosure relates to a method of detecting a voltage level of an RF input signal. In these implementations, the method comprises rectifying the RF input signal with a detection transistor, dc-offsetting the rectified RF input signal using a reference transistor that is not configured to receive the RF input signal, generating a first correction voltage based on the thermal voltage, generating a second correction voltage that is based on a voltage difference between the detection transistor and the reference transistor, and providing an output signal based on the voltage level of the RF input signal and the first and second correction voltages.

In some embodiments, the second correction voltage is generated based on a voltage difference between the detection transistor and the reference transistor without taking into account the first correction voltage. In some embodiments, the first voltage correction is $V_T \cdot \ln(2)$.

In some embodiments, the second voltage correction is based on a sigmoid function of a voltage difference between the detection transistor and a second reference transistor. In some embodiments, the second voltage correction is based on a hyperbolic tangent of the voltage difference between the detection transistor and the second reference transistor divided by twice the thermal voltage.

In some embodiments, the method includes generating a differential current using a differential pair of transistors coupled to the detection transistor and the second reference transistor, the generated differential current being proportional to the hyperbolic tangent of the voltage difference between the detection transistor and the second reference transistor divided by twice the thermal voltage, the second voltage correction being based on the differential current.

In some embodiments, the method includes low-pass filtering the detection transistor voltage prior to generating the differential current based on the filtered detection transistor voltage.

The correction proposed by Meyer provides a constant term of $V_T \cdot \ln(2)$ to the detector response regardless of the voltage level of the RF input signal. It can be viewed as a first-order correction to the uncorrected detector output. The approach of the present disclosure can be viewed as an analogous to a second-order or higher order correction to the detector output in that it is based on the detector output. At its most general, the present disclosure relates to the use of the detector output to obtain a higher-order correction to the detector output than obtained by Meyer. The higher-order correction may be a linear function of the detector output or may be a non-linear function of the detector output, such as a smooth non-linear function or a non-linear function consisting of two or more piece-wise linear portions.

In some circuits embodying aspects of the present disclosure, the detector output used to obtain the higher-order correction is the detector output that would have been obtained in the absence of the first (Meyer) voltage correction. This may be the uncorrected detector output.

In some circuits embodying aspects of the present disclosure, the magnitude of the additional correction varies with the uncorrected detector output for input signals having uncorrected detector output in a particular range, and does not vary or does not substantially vary for input signals having uncorrected detector output in another range.

In some circuits embodying aspects of the present disclosure, the magnitude of the additional correction may vary with uncorrected detector output for input signals having uncorrected detector output lower than a threshold, and not vary or not vary substantially for uncorrected detector output above a threshold. The threshold may be a hard threshold in which the change between the two regimes is sharp or a soft threshold, in which the change between the two regimes is gradual over a transition range. Input signals of small peak voltage resulting in uncorrected detector output lower than the hard or soft threshold may receive an additional correction specific to the particular peak voltage of the input signal and input signals of higher peak voltage resulting in higher uncorrected detector output higher than the hard or soft threshold may receive an additional correction that is the same additional correction that would be received for input signals having an even higher peak voltage as the additional correction does not change substantially with uncorrected detector output above the threshold. In other circuits embodying aspects of the present disclosure, the additional correction may continue to increase with increasing uncorrected detector output for uncorrected detector output above the threshold, but at a slower rate than for uncorrected detector output below the threshold.

In some circuits embodying aspects of the present disclosure, the magnitude of the additional correction may increase monotonically with increasing input signal peak voltage or uncorrected detector output up to a threshold, and particularly a soft threshold, and above the threshold the magnitude of the additional correction may be constant or substantially constant, not varying with further increase of input signal peak voltage or uncorrected detector output.

In some circuits embodying aspects of the present disclosure, the additional correction may be a sigmoid function of uncorrected detector output. The sigmoid function may be applied to the uncorrected detector output and may provide alternative or additional improvement of the detector output. A sigmoid function is a mathematical function having an "S"

shape (sigmoid curve). For inputs greater than zero, the sigmoid curve provides an increasing output with increase in input up to a soft threshold before becoming asymptotic to a constant value for arriving at the constant value. One special case of a sigmoid function is the logistic function defined by the formula $1/(1+e^{-t})$. The logistic function is sometimes referred to as "the sigmoid function" but herein the term "sigmoid function" is used more generally to refer to the class of "S"-shaped curves. Other examples of sigmoid functions include the error function, the arctangent, and the hyperbolic tangent. Other sigmoid functions may not have a definition over the entire domain but instead may be defined piecewise, having a sigmoid curve over a range of interest. In some cases, a sigmoid curve can be obtained conveniently in an electronic circuit making use of nonlinear effects of a transistor. A preferred sigmoid curve used in some detectors embodying aspects of the present disclosure is the hyperbolic tangent.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

BRIEF DESCRIPTION OF THE DRAWINGS

Aspects of this disclosure will be described in more detail by way of example only with reference to the accompanying drawings. The components within the drawings are not necessarily to scale, emphasis instead being placed upon clearly illustrating principles.

DETAILED DESCRIPTION OF SOME EMBODIMENTS

Although described in the present disclosure with particular reference to detecting the output of a power amplifier, detectors according to the present disclosure can be implemented in any system where it is desirable to use a peak detector for measuring a peak voltage of a signal. While detectors embodying aspects of the present disclosure find particular application for detecting RF input signals, such detectors may be used to detect the peak voltage of a lower frequency signal.

Figure 1:
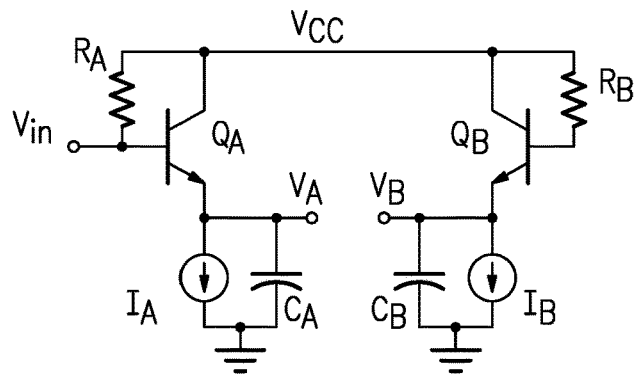
FIG. 1 is a schematic of a prior art detector circuit according to Meyer's approach.

FIG. 1 is a schematic diagram of a circuit according to Meyer's approach and comprises two bipolar NPN transistors $Q_A$ and $Q_B$. Collector terminals of $Q_A$ and $Q_B$ are connected directly to a supply voltage at Vcc. The base of $Q_B$ is connected to Vcc via resistor $R_B$ and the base of $Q_A$ is also connected to Vcc via resistor $R_A$. The emitter of $Q_A$ is connected to ground via, in parallel, current source $I_A$ and capacitor $C_A$. The emitter of $Q_B$ is connected to ground via, in parallel, current source $I_A$ and capacitor $C_B$.

An RF input signal Vin is applied to the base of $Q_A$, which acts as a nonlinear rectifying element on the input signal. Transistor $Q_A$ provides voltage $V_A$ at its emitter. The second transistor $Q_B$ sets up an offsetting dc voltage $V_B$ at its emitter, so that the dc voltage Vout, between the emitter of $Q_A$ at voltage $V_A$ and the emitter of $Q_B$ at voltage $V_B$ is zero for zero ac signal input. The capacitor $C_B$ at the emitter of $Q_B$ acts as a filter to prevent Vcc noise from corrupting Vout. The capacitor $C_A$ is the hold capacitor whose value is set by the allowable droop ΔVout on Vout via equations $d/dt(Vout) = -I_A/C_A$ and so $\Delta Vout = -I_A \cdot \Delta t / C_A$, wherein d/dt(Vout) is the derivative of Vout with respect to time and Δt is approximately half the period of the input signal.

Meyer considers the operation of the circuit for an ideal square wave input of peak amplitude $V_1$, assumed to be much larger than thermal voltage $V_T$. Under Meyer's assumptions, the current source forces the average current in $Q_A$ to be equal to $I_A$. As $Q_A$ is only conducting for 50% of the time, $Q_A$ will conduct with current $2 \cdot I_A$ when Vin is high (on the square wave input assumption) and not conduct at all when Vin is low. Meyer suggests that, if $I_A = I_B$, $R_A = R_B$ and $Q_A$ and $Q_B$ are matched, then $Vout = V_1 - V_T \cdot \ln(2)$. According to Meyer's analysis, the output voltage of the detector is equal to the peak voltage of the input signal offset by the derived error term of $V_T \cdot \ln(2)$, wherein $V_T$ is the thermal voltage given by $k_b T/q$ and ln(2) is the natural logarithm of 2. Meyer suggests that the derived error term $V_T \cdot \ln(2)$ can be cancelled by making $I_B = 2I_A$ and $R_B = R_A/2$. According to Meyer's analysis, this will cause Vout to equal $V_1$ as desired.

The effect of making $I_B = 2I_A$ and $R_B = R_A/2$ is that the current density in $Q_B$ is twice that of the average current density in $Q_A$, and equal to the current density while $Q_A$ is conducting. By setting the current densities in $Q_A$ and $Q_B$ in this way, a correction of $V_T \cdot \ln(2)$ is provided to the uncorrected output of the dc offset corrected rectifying element $Q_A$.

Increasing the current density in $Q_B$ relative to the average current density in $Q_A$ compensates for the fact that $Q_A$ might only be conducting for a portion of the time. Therefore the average current density in $Q_B$ may be increased relative to the average current density in $Q_A$ to provide a voltage correction. If the input signal is a square wave, i.e. the signal is at positive peak voltage for 50% at the time and negative peak voltage for 50% of the time, then doubling of the current density in $Q_B$ relative to the average current density in $Q_A$ may be the appropriate degree of compensation.

Despite the Meyer's voltage correction of $V_T \cdot \ln(2)$, practical implementations of the schematic of FIG. 1 may not necessarily provide a linear output Vout that is equal to the peak RF voltage $V_1$ for all Vin. This is partly because the assumptions made by Meyer are not entirely valid for general signals.

Figure 2:
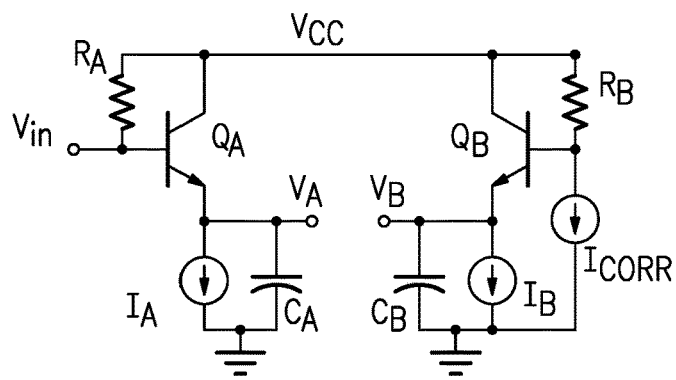
FIG. 2 is a schematic of a first circuit embodying an aspect of the present disclosure.

FIG. 2 is a schematic diagram of a circuit embodying an aspect of the present disclosure. It is based on the circuit of FIG. 1 but incorporates an additional correction $\Delta V$ to the dc output voltage Vout provided by current source Icorr between the base of $Q_B$ and ground. The additional correction $\Delta V$ is given by the expression $k \cdot I_d \cdot \tanh((V_A - V_B)^U / (2 \cdot V_T))$, in which k is a factor having dimensions of resistance, $I_d$ is a current, tanh is the hyperbolic tangent function, and $(V_A - V_B)^U$ is the difference in voltages on the emitter of $Q_B$ and $Q_A$ if Meyer's correction to the currents through $Q_A$ and $Q_B$ had not been applied, the superscript U signifying "uncorrected".

Figure 3:
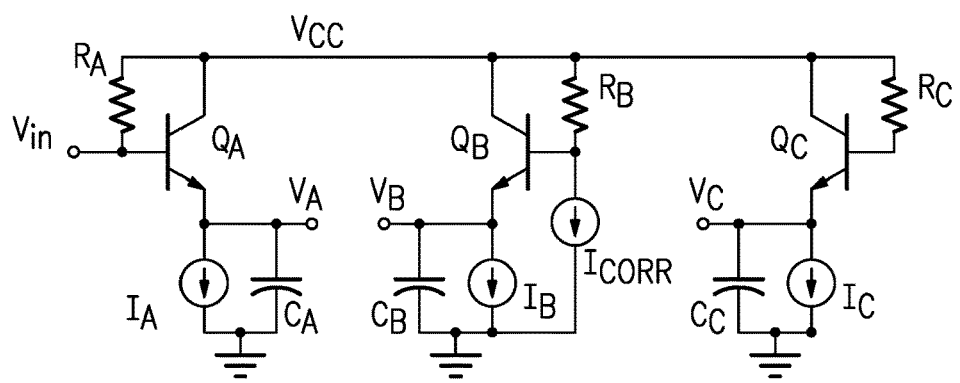
FIG. 3 is a schematic of a second circuit embodying an aspect of the present disclosure.

FIG. 3 is a schematic diagram of a circuit embodying an aspect of the present disclosure. It is based on the circuit of FIG. 2 and incorporates an additional reference transistor $Q_C$, the collector of which being directly connected to Vcc in the same manner as $Q_A$ and $Q_B$, and the base being connected to Vcc via resistor $R_C$. The emitter voltage has dc voltage $V_C$ and is connected to ground via, in parallel, capacitor $C_C$ and current source $I_C$. The additional transistor $Q_C$ provides a second dc mirror of transistor $Q_A$ in which the Meyer correction is not applied, i.e. $I_C = I_A$ and $R_C = R_A$ and $Q_A$ and $Q_C$ are matched. Therefore the voltage between $V_A$ and $V_C$ will be equal to $(V_A - V_B)^U$. In this way, the difference in voltage between the emitters of transistors $Q_A$ and $Q_C$ can be used to obtain $\tanh((V_A - V_B)^U / (2 \cdot V_T))$ for applying the additional correction.

Figure 4:
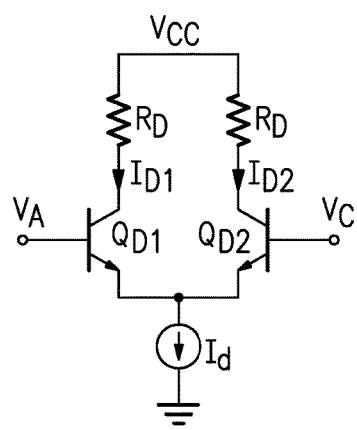
FIG. 4 is a schematic of a portion of a circuit embodying an aspect of the present disclosure

FIG. 4 is a schematic diagram of a circuit in which a tanh function arises and from which a voltage correction $\Delta V$ of $k \cdot I_d \cdot \tanh((V_A - V_B)^U / (2 \cdot V_T))$ can be produced. FIG. 4 shows an bipolar differential pair in which the emitters of two NPN transistors $Q_{D1}$ and $Q_{D2}$ are coupled together and the emitters are connected to ground via a current source $I_d$, which is a proportional-to-absolute-temperature (PTAT) source. The collectors of transistors $Q_{D1}$ and $Q_{D2}$ are coupled to a supply voltage Vcc via respective resistors $R_D$. The base voltage of $Q_{D1}$ is $V_A$, obtained from the emitter of transistor $Q_A$ in the circuit of FIG. 3, and the base voltage of $Q_{D2}$ is $V_C$, obtained from the emitter of transistor $Q_C$ in the circuit of FIG. 3. The collector current of $Q_{D1}$ is $I_1$ and the collector current of $Q_{D2}$ is $I_2$. It can be shown that the difference in currents between the collectors of $Q_{D2}$ and $Q_{D1}$, $I_2 - I_1$, is given by $\alpha_F \cdot I_d \cdot \tanh((V_A - V_C)/(2 \cdot V_T))$, in which $\alpha_F$ is the common-base current gain. Since $\alpha_F$ is close to unity, we can write that the difference in currents, $I_2 - I_1$, is $I_d \cdot \tanh((V_A - V_C)/(2 \cdot V_T))$.

This difference in currents can be supplied to transistor $Q_B$ to provide current Icorr which, by which the additional voltage correction $\Delta V$ between $V_A$ and $V_B$ can be produced.

The circuits of FIGS. 2 and 3 provide the second voltage correction by drawing a particular current at the base of the first reference transistor $Q_B$. Other circuits embodying aspects of the present disclosure may apply the correction via different means. Due to the hold capacitor $C_A$ of the detector, the detected voltage level and voltage corrections are at a lower frequency than the RF signals. They represent the envelope or amplitude modulation of the RF signal. Therefore it may not be necessary to consider RF operation of the means by which the correction is applied. As an example, voltage addition can be achieved using a standard op amp voltage addition circuit, if the op amp can operate at the modulation frequency of the envelope. This example is not exhaustive and other appropriate techniques for voltage addition will be apparent to the skilled reader.

Figure 5:
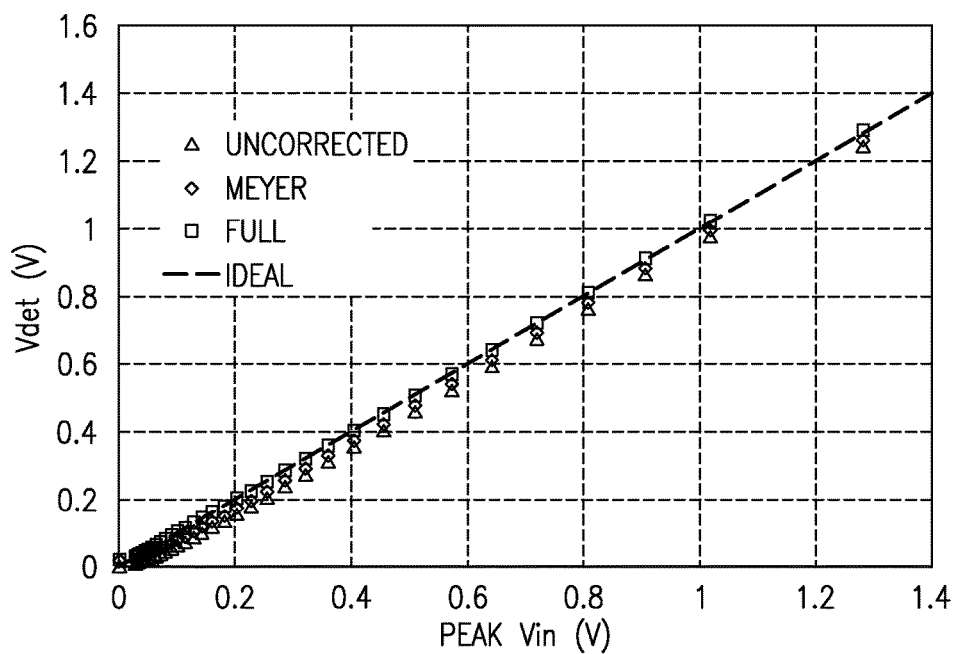
FIG. 5 is a plot comparing output of an uncorrected detector operating at 313K with an ideal detector, a Meyer-corrected detector, and a detector corrected according to an aspect of the present disclosure, for input RF signals of peak voltage in the range 0V to 1.4V.

FIG. 5 is a plot comparing the response at an operating temperature of 313K (40° C., approx. 104° F.) of an uncorrected detector, a detector corrected by Meyer's $V_T \cdot \ln(2)$ correction term, and a full correction including Meyer's $V_T \cdot \ln(2)$ term and the $k \cdot I_d \cdot \tanh((V_A - V_B)^U / (2 \cdot V_T))$ as provided in the circuits of FIGS. 2, 3 and 4, to an ideal detector providing detected voltage level Vdet=Peak Vin over the range for RF input signals Vin having peak voltages in the range 0V to 1.4V. The response voltage data of the uncorrected detector results from simulation data of a real diode detector on a silicon-germanium process obtained using Cadence™ electronic design software (Cadence Design Systems, Inc., CA, USA), the simulated input RF signal having the form of a sine wave.

To simulate a detector incorporating Meyer's correction, $V_T \cdot \ln(2)$ was evaluated at 313K and added to the Vdet values obtained for the uncorrected detector. To simulate the full correction, both Meyer's $V_T \cdot \ln(2)$ term and $k \cdot I_d \tanh((Vdet/(2 \cdot V_T))$ were added to the Vdet values obtained for the uncorrected detector. As k has dimensions of resistance and is a somewhat empirical correction, this value was adjusted to provide closest agreement with the ideal detector output over the range. For high values of peak RF input signal Vin, the detected voltages Vdet of the uncorrected detector, Meyer-corrected detector and a detector incorporating the full correction, i.e. Meyer and the additional hyperbolic tangent correction, lie on or close to the line of an ideal detector, Vdet=Peak Vin. At lower levels of input signal, the uncorrected detector output falls significantly below the ideal detector output. The Meyer-corrected detector and particularly the fully corrected detector appear to provide an output closer to the ideal detector at lower values of Vin.

Figure 6:
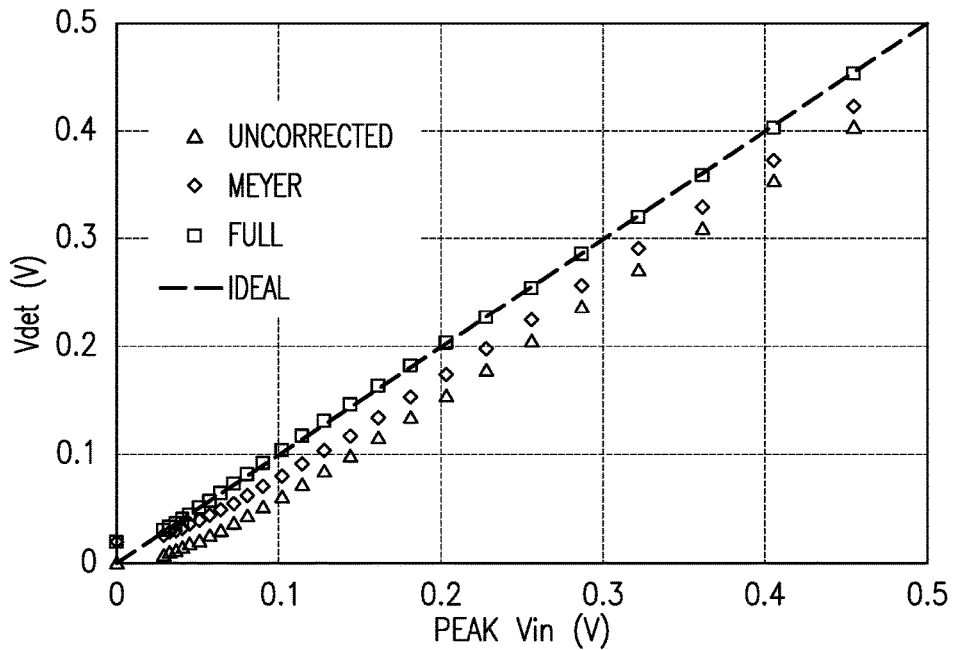
FIG. 6 is a plot similar to FIG. 5, in which input RF signals are restricted to the peak voltage range of 0V to 0.5V.

FIG. 6 is a plot of the same data as FIG. 5 with the voltage level of the input signal limited to the range 0V to 0.5V to explore the performance of the detectors at lower voltage levels. The simulation results of the full correction lie on or close to the line of the ideal detector for almost the entire range input voltage range. The only significant difference is at zero RF signal, when the Meyer correction term $V_T \cdot \ln(2)$ present in the full correction provides a non-zero offset to Vdet. The Meyer detector also includes this correction term and so also has a non-zero offset to Vdet at zero RF input signal. However, the Meyer detector does not provide results as close to the ideal detector as the fully corrected detector.

Figure 7:
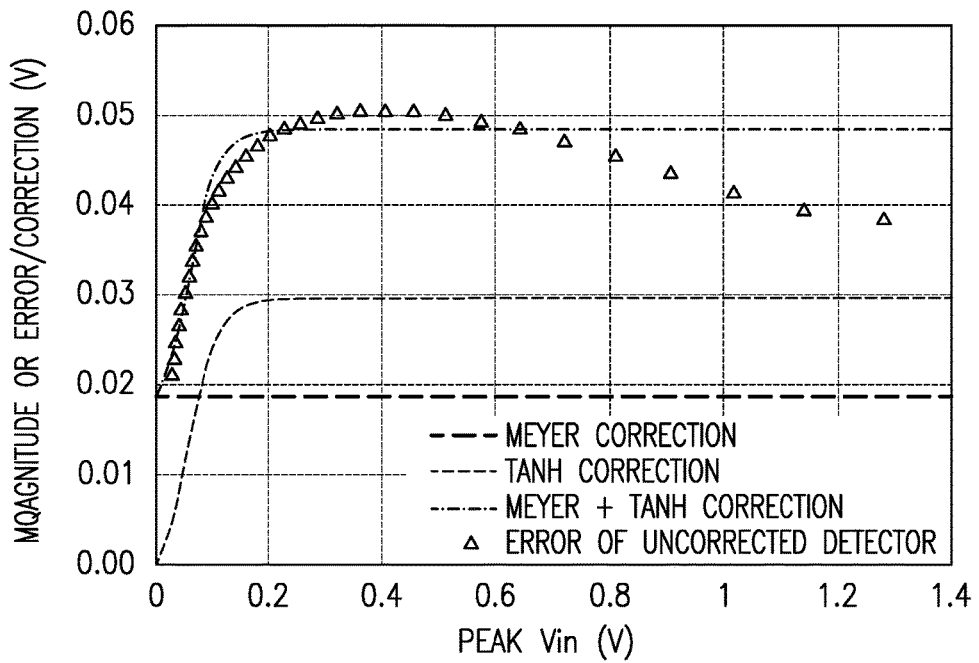
FIG. 7 is a plot of difference in response between an ideal detector and an uncorrected detector at operating at 313K, as well as the Meyer correction, an additional correction embodying an aspect of the present disclosure, and the Meyer and additional, for input signals having peak voltages in the range 0V to 1.4V.

FIG. 7 is a plot of the magnitude of the error ("Error of uncorr. Det."), i.e. difference in response, between the uncorrected detector operating at 313K and the ideal detector, as well as the different correction terms used by the Meyer detector ("Meyer correction") and a fully corrected detector embodying an aspect of this disclosure ("Tanh correction" and "Meyer+Tanh correction"). The Meyer correction term $V_T \cdot \ln(2)$ is constant for all input voltage levels and appears as a horizontal line at approximately 0.019V for the operating temperature of 313K. While this correction reduces the error over the input signal peak voltage range of 0V to 1.4V, FIG. 7 shows that there remains a significant difference between the ideal detector output and the response of the Meyer-corrected detector.

The fully corrected detector includes an additional voltage correction including a hyperbolic tangent term and FIG. 7 demonstrates that this additional voltage correction provides closer agreement with the error between the uncorrected detector at 313K and the ideal detector in the range 0V to 0.5V, while falling off in absolute terms as Vin increases. However, the difference between the error term for the uncorrected detector and the combined voltage corrections of Meyer and the additional hyperbolic tangent term remains smaller than the difference between the error term for the uncorrected detector and the Meyer correction term alone over the whole voltage range 0V to 1.4V. FIG. 7 therefore indicates that, at 313K at least, the additional voltage correction provides an improvement over the Meyer detector.

While the correction shown in FIG. 7 is includes a hyperbolic tangent term, other corrections that are also based on the uncorrected detector output, i.e. varying with input signal peak voltage level, may also provide an improved detection relative to the Meyer correction. For example, in place of the hyperbolic tangent function, the a piecewise correction may be linearly increasing for input voltage levels from zero increasing up to a hard threshold, and then constant for input voltage levels higher than the threshold. The hard threshold may be equivalent to an input signal peak voltage of about 0.1V, corresponding to around 0.05 to 0.07V of the uncorrected detector output voltage, according to the plot of FIG. 6. This correction may be implemented using an amplifier having a gain providing the initial slope for low values of detector output, the output of the being limited, for example by saturation at the amplifier's supply voltages. As an alternative, an amplifier may use of gain compression to provide a higher gain for lower values of input voltage or soft limit, the gain reducing as the voltage increases, either to zero or to a smaller gain than for the lower values of input voltage. Alternatively, another sigmoid curve may be applied such as via an arctangent circuit although this might not necessarily be as conveniently realisable as the hyperbolic tangent function or piecewise output-limited amplifier.

FIG. 7 shows that, in general, an additional correction beyond the Meyer correction may provide an improved response for the simulated detector, the additional correction being based on the uncorrected detector output and has a relatively high gain up to a threshold and a low or zero gain above the threshold, the threshold being in the region of or varying gradually over the range of about 0.1V to about 0.2V peak voltage of input signal, corresponding to about 0.05V to about 0.15V (or equivalently 50 to 150 mV) of uncorrected detector output voltage according to the graph uncorrected detector voltage against peak voltage of input signal in FIG. 6. Due to similar behaviour in other processes of bipolar transistors such as the simulated detector's NPN transistors, it is believed that an additional correction of this form may also be advantageous to processes other than the silicon-germanium process in which the detector was simulated, although parameters such as the magnitude of the correction may need to vary to obtain the best agreement with the ideal detector in processes other than silicon-germanium. Nonetheless, a generalized correction of high gain for uncorrected detector voltage below a threshold, low or zero gain above the threshold, the threshold being in the region of or varying gradually over the range of about 50 to about 150 mV, may feasibly still provide an improvement over the Meyer correction alone in processes other than silicon-germanium.

Figure 8:
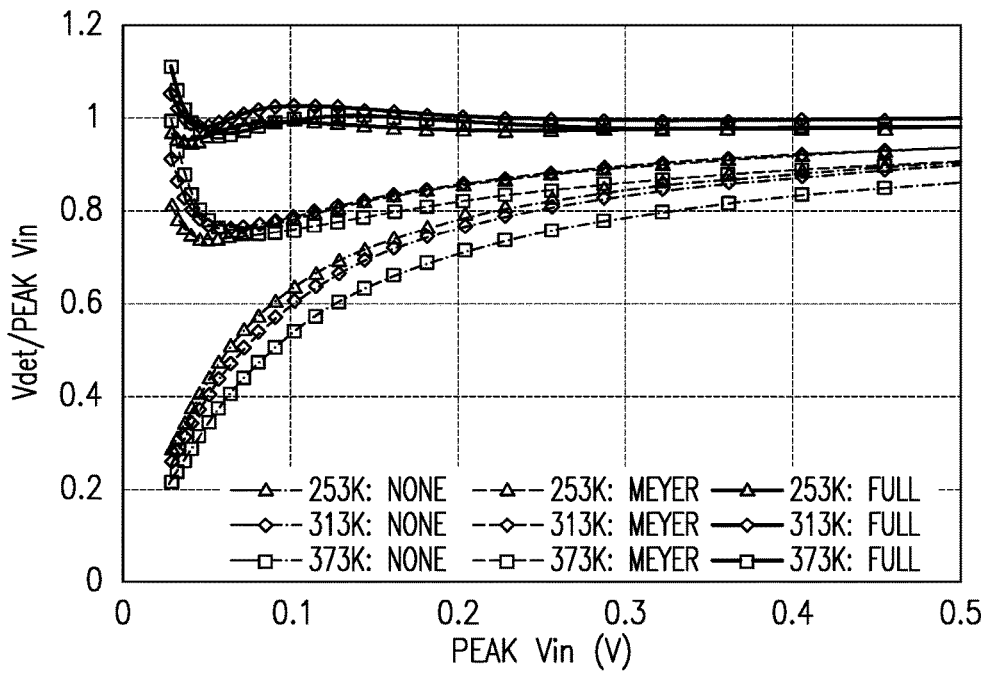
FIG. 8 is a plot of linearity at different operating temperatures for the uncorrected detector, the Meyer detector and a detector embodying an aspect of the present disclosure.

FIG. 8 is a plot showing the linearity of response of the uncorrected detector, Meyer detector and fully corrected detector at different operating temperatures. Vdet divided by Peak Vin is plotted against Peak Vin for each of the uncorrected, Meyer and fully corrected detectors at simulation temperatures of 253K, 313K and 373K (−20° C., 40° C. & 100° C., approx. −4° F., 104° F. & 212° F.). Cadence™ simulation results were obtained for a real diode detector at each of the simulation temperatures, and thermal voltages for the correction voltages were calculated according to the respective simulation temperature. For an ideal detector having perfectly linear output, a plot of Vdet/Peak Vin against Peak Vin should provide a straight horizontal line at Vdet/Peak Vin=1. The degree to which simulated results deviate from this line gives an indication of a detector's linearity of response or lack thereof. By including the results of different operating temperatures, the sensitivity of the linearity to temperature for each detector can be explored. The plot of FIG. 8 is restricted to Peak Vin in the range 0V to 0.5V because FIGS. 5 and 6 show that the lower end of the voltage range is where the detectors tend to deviate most from linearity.

The results from the fully corrected detectors at all of the operating temperatures (solid lines) lie on or close to the horizontal line Vdet/Peak Vin=1 at all but the smallest Vin values, within the range Vdet/Peak Vin=0.95 to 1.05 at all simulated temperatures down to Vin=0.045V. By contrast, the Meyer detector remains within the range Vdet/Peak Vin=0.95 to 1.05 only down to approximately Vin=1V (not shown in FIG. 8), within the broader range Vdet/Peak Vin=0.90 to 1.10 only down to Peak Vin=0.5V (not shown in FIG. 8), and within the broader range Vdet/Peak Vin=0.80 to 1.20 only down to Vin=0.16V. The uncorrected detector fairs worse in these simulations, being unable to remain within the Vdet/Peak Vin=0.95 to 1.05 range for all simulated temperatures at any of the simulated Vin values, within the broader range Vdet/Peak Vin=0.90 to 1.10 only down to Vin=0.7V (not shown in FIG. 8), and within the broader range Vdet/Peak Vin=0.80 to 1.20 only down to Vin=0.3V. From these simulation results, the fully corrected detector may offer improved linearity over a broad range of operating temperatures compared with the Meyer detector and an uncorrected detector.

Figure 9:
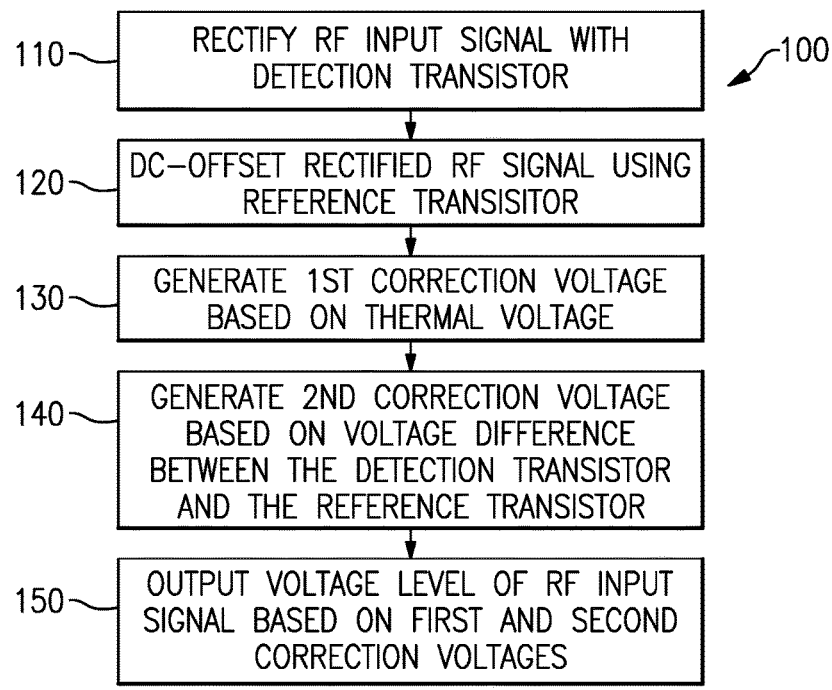
FIG. 9 is a flow diagram illustrating a technique for detecting a voltage level of an RF input signal embodying an aspect of the present disclosure.

FIG. 9 is a flow diagram illustrating a technique embodying an aspect of the present disclosure. A method 100 of detecting a peak voltage of an RF input signal is illustrated, the method including a first step 110 of rectifying an RF input signal with a detection transistor.

The second step 120 is to dc-offset the rectified RF signal using a reference transistor. This may carried out by not supplying the input signal to the reference transistor that is otherwise set up and biased in a similar to the detector transistor, at least for zero ac input.

The third step 130 is to generate a first correction voltage based on the thermal voltage. The first voltage correction may be equal to $V_T \cdot \ln(2)$ and may be generated at a first reference transistor. Generating the first correction voltage may require that the first reference transistor is not in fact biased identically to the detector transistor for zero ac input as the correction will be provided even for zero ac input. Generating the first correction voltage may comprise operating the first reference transistor at a higher current density than the average current density of the detection transistor.

The fourth step 140 is to generate a second correction voltage based on the voltage difference between the detection transistor and a reference transistor. This may be obtained without taking into account the first voltage correction. The second voltage correction may be based on a sigmoid function of a voltage difference between the detection transistor and a second reference transistor that is not configured to receive the RF input and may further be based on a hyperbolic tangent of the voltage difference between the detection transistor and the second reference transistor divided by twice the thermal voltage. This may be carried out using a differential pair of transistors connected between the detection transistor and the second reference transistor. The second voltage correction may also be generated at the first reference transistor, which may involve the mirroring of a current of the correction to the first reference transistor.

The fifth step is to providing an output signal based on the voltage level of the RF input signal and the first and second correction voltages. This may be a differential output signal or a single-ended output signal relative to some datum such as a ground or supply voltage.

Steps of the method of FIG. 9 are not necessarily carried out in sequence in the order of FIG. 9. The flow arrows of the flow diagram may represent a conceptual flow of information helpful to the understanding of the method even through all steps take place simultaneously. For example, the dc-offsetting may take place in an electronic circuit at the same time as the rectification of the RF signal, and the first and second correction voltages may also be generated simultaneously.

Figure 10:
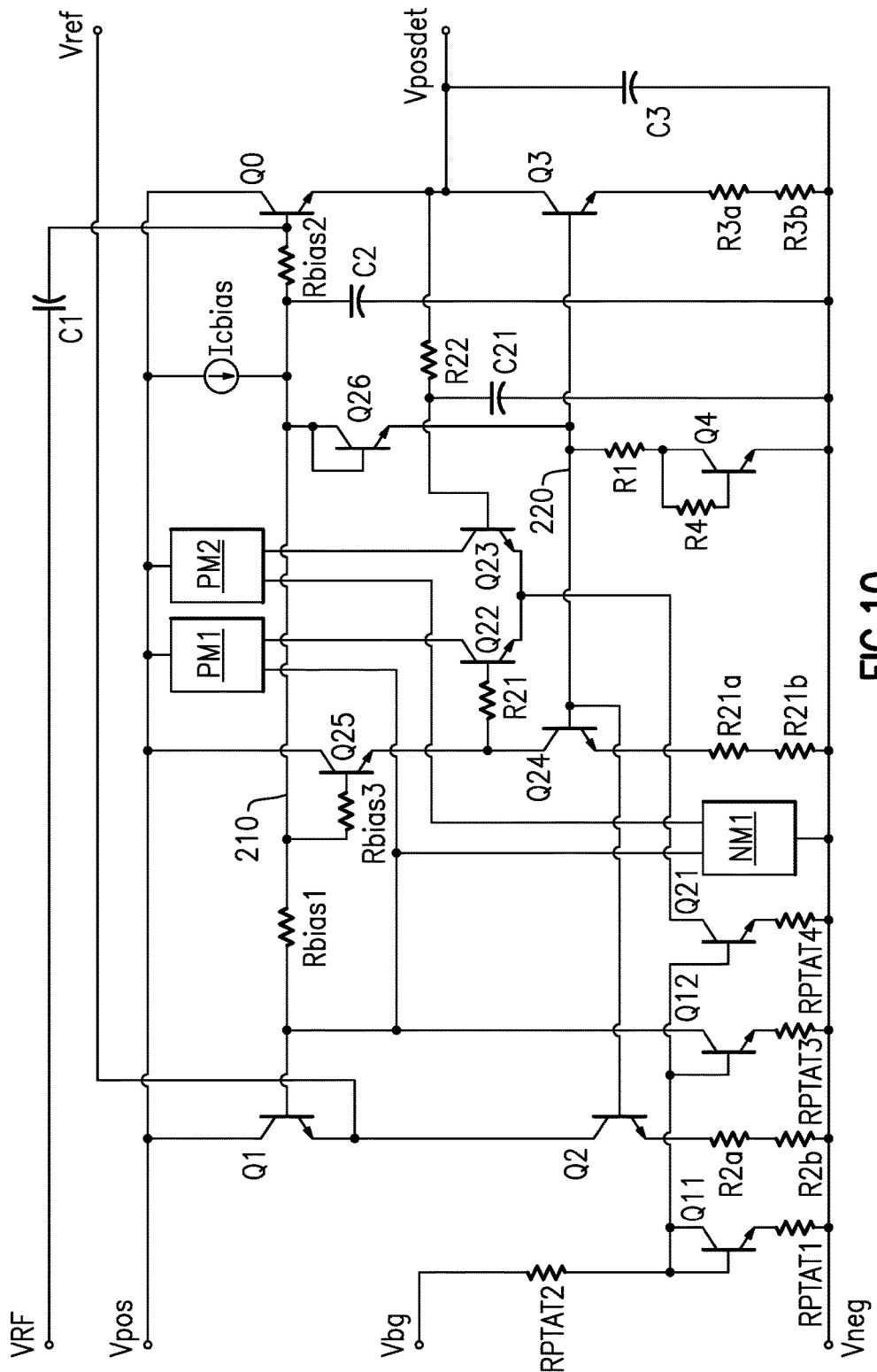
FIG. 10 is a schematic of a third circuit embodying an aspect of the present disclosure.

FIG. 10 is a schematic diagram of a circuit embodying an aspect of the present disclosure. Input nodes on the left-hand side are Vpos and Vneg, which are positive and negative supply inputs, VRF, which is the RF input signal for which a peak voltage level is to be determined, and Vbg, which is a band gap voltage reference. Output nodes on the right-hand side are Vref and Vposdet, between which the voltage difference Vposdet−Vref is provided as the determined peak voltage level of the RF input signal.

Vpos connects to the collectors of transistors Q1, Q25 and Q0, and to PFET mirror PM1 and PFET mirror PM2. Current source Icbias connected between Vpos and a first internal node 210 provides a current from Vpos to first internal node 210. VRF connects to the base of transistor Q0 via capacitor C1. First internal node 210 is connected to the base of transistor Q1 via resistor Rbias1, to the base of transistor Q1 via resistor Rbias2 and to the base of transistor Q25 via resistor Rbias3. First internal node 210 is connected to Vneg via capacitor C2. First internal node 210 is connected to second internal node 220 via transistor Q26, by which the base and collector of transistor Q26 are connected to first internal node 210 and the emitter of transistor Q26 is connected to second internal node 220. The emitter of Q1 is connected to output node Vref and to the collector of transistor Q2. The emitter of transistor Q0 is connected to output node Vposdet, to Vneg via capacitor C3, and to the collector of transistor Q3.

The emitter of transistor Q0 is connected to the base of transistor Q23 via resistor R22. The base of transistor Q23 is connected to Vneg via capacitor C21. The emitter of transistor Q25 is connected to the collector of transistor Q24. The emitter of transistor Q25 is connected via resistor R21 to the base of transistor Q22. The bases of transistors Q2, Q3 and Q24 are connected to second internal node 220. Second Internal node 220 is connected to the collector of transistor Q4 via resistor R1. The collector of transistor Q4 is connected to its own base via resistor R4. The emitter of transistor Q4 is connected to Vneg. The emitter of transistor Q3 is connected to Vneg via resistors R3a and R3b in series. The emitter of transistor Q2 is connected to Vneg via resistors R2a and R2b in series. The emitter of transistor Q24 is connected to Vneg via resistors R21a and R21b in series.

Input node Vbg is connected via resistor RPTAT2 to the collector of transistor Q11. The bases of transistors Q11, Q12 and Q21 are also connected to the collector of transistor Q11. The emitter of transistor Q11 is connected to Vneg via resistor RPTAT1. The emitter of transistor Q12 is connected to Vneg via resistor RPTAT3. The emitter of transistor Q21 is connected to Vneg via resistor RPTAT4. The collector of transistor Q12 is connected to the base of transistor Q1.

The emitters of transistors Q22 and Q23 are connected together and to the collector of transistor Q21. The emitter of transistor Q22 is connected to a mirrored-current input node of PFET mirror PM1. The emitter of transistor Q23 is connected to a mirrored-current input node of PFET mirror PM2. The mirrored-current input node of PFET mirror PM2 is connected to a mirrored-current input node of NPN mirror NM1. The mirrored-current output node of PFET mirror PM1 is connected to a mirrored-current output node of NPN mirror NM1 and to the base of transistor Q1. NPN mirror NM1 is also separately connected to Vneg. All of transistors Q0, Q1, Q2, Q3, Q4, Q11, Q12, Q21, Q22, Q23, Q24, Q25 and Q26 shown in FIG. 10 are NPN bipolar transistors.

Figure 11:
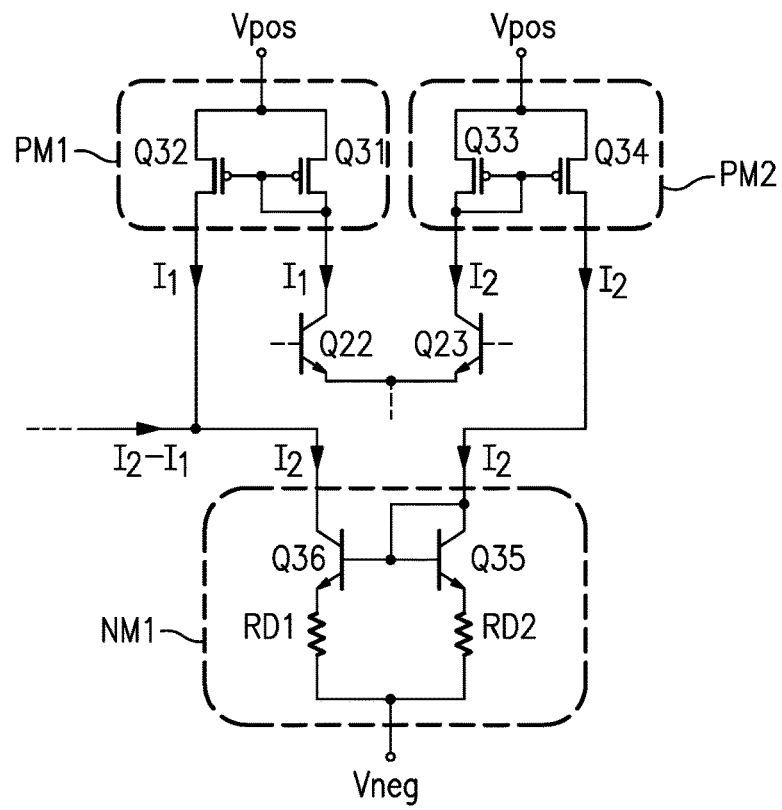
FIG. 11 is a schematic of PFET and NPN current mirrors that form part of the circuit of FIG. 10.

FIG. 11 is a schematic diagram showing further circuit details of PFET mirrors PM1, PM2 and NPN mirror NM1 in the context of emitter-coupled transistors Q22 and Q23. PFET mirror PM1 contains two PMOS transistors Q32 and Q31 in a current-mirror configuration, with drains of each of transistors Q32 and Q31 connected to Vpos. The gates of PMOS transistors Q32 and Q31 are connected together and to the source of PMOS transistor Q31, which is connected to the emitter of NPN transistor Q22. In a similar fashion, PFET mirror PM2 contains two PMOS transistors Q33 and Q34 in a current-mirror configuration, with drains of each of transistors Q33 and Q34 connected to Vpos. The gates of PMOS transistors Q33 and Q34 are connected together and to the source of PMOS transistor Q33, which is connected to the emitter of NPN transistor Q23.

NPN mirror NM1 contains two NPN transistors Q35 and Q36, the bases of NPN transistors Q35 and Q36 being connected together and to the emitter of NPN transistor Q35. Emitter degeneration is present for each of NPN transistors. The emitter of NPN transistor Q35 is connected to Vneg via resistor RD2. The emitter of NPN transistor Q36 is connected to Vneg via resistor RD1. The source of PMOS transistor Q34 in PMOS mirror PM2 is connected to the emitter of NPN transistor Q35 in NPN mirror NM1. The source of PMOS transistor Q32 in PMOS mirror PM1 is connected to the emitter of NPN transistor Q36 in NPN mirror NM1, as well as to the base of transistor Q1 (not shown).

In the circuit of FIG. 10, transistor Q0 is the detection transistor corresponding to transistor $Q_A$ in the circuit of FIG. 3. The emitter of Q0 provides the positive terminal Vposdet corresponding to terminal $V_A$ in the circuit of FIG. 3, with capacitor C3 acting as the hold capacitor to smooth the output between cycles of the RF input signal. The input RF signal enters the circuit at input node VRF, via decoupling capacitor C1 and is supplied to the base of detection transistor Q0.

Transistor Q1 is a first reference transistor corresponding to transistor $Q_B$ in the circuit of FIG. 3, used to dc provide the appropriate dc offset. As with the circuits of FIGS. 1 to 3, a voltage correction of $V_T \cdot \ln(2)$ is generated at the emitter of first reference transistor Q1, but by a different method than proposed by Meyer and shown in FIGS. 1 to 3. Instead of being configured to have a current density twice that of the detection transistor Q0 to generate the voltage correction, the correction is provided by modifying the base current to offset the voltage at the emitter. The offsetting current is provided by PTAT current source of transistor Q12 to generate the voltage offset of $V_T \cdot \ln(2)$.

Transistor Q25 is a second reference transistor corresponding to transistor $Q_C$ in the circuit of FIG. 3. The Meyer voltage correction of $V_T \cdot \ln(2)$ is not generated at the second reference transistor Q25 and so the difference in emitter voltages between transistors Q0 and Q25 is that which would have been obtained between transistors Q0 and Q1 if the $V_T \cdot \ln(2)$ voltage correction were not applied.

Capacitor C2 connecting between first internal node 210 and Vneg allows the high-frequency components of the measured RF input signal on VRF to bypass the rest of the circuit. This allows first and second reference transistors Q1 and Q25 to act without the input of the RF signal.

Transistors Q22 and Q23 are in an emitter-coupled differential pair configuration, wherein the bases of Q22 and Q23 connect, via resistors R21 and R22 respectively, to the emitters of second reference transistor Q25 and detection transistor Q0 respectively.

The purpose of resistor R22 between the emitter of detection transistor Q0 and the base of transistor Q23 of the differential pair is to act with capacitor C21 between the base of Q23 and Vneg as a low-pass filter, to remove or reduce the effect of voltage ripple in the output at the emitter of detection transistor Q0. Such ripple might arise due to voltage drop from the charged capacitor when Q0 is not conducting. To compensate for the presence of resistor R22 between the base of the differential pair transistor Q23 and the emitter of detection transistor Q0, a corresponding resistor R21 is included between the emitter of second reference transistor Q25 and the base of differential pair transistor Q22.

As shown in FIG. 11, the difference in voltage between the bases of the differential pair transistors Q22 and Q23, arising from the difference in voltage between the emitters of detection transistor Q0 and second reference transistor Q25, draws a current $I_1$ from PFET mirror PM1 and $I_2$ from PFET mirror PM2. PFET mirror PM2 mirrors the current $I_2$ to a first port of NPN mirror NM1 and PFET mirror PM1 mirrors the current $I_1$ to a second port of the NPN mirror NM1. However, the NPN mirror NM1 is also configured to mirror the current $I_2$ from its first port to its second port. Therefore at the junction between the PFET mirror PM1, the NPN mirror NM1 and a connection to the base of the first reference transistor Q1 (not shown in FIG. 11), PFET mirror PM1 provides current I1 to the junction mirrored from the collector of differential pair transistor Q22, NPN mirror NM1 draws current I2 from the junction mirrored via PFET mirror PM1 from the collector of differential pair transistor Q23. As the currents to a junction are required to sum to zero, this causes a current to be drawn to the junction from the base of the first reference transistor Q1, the current drawn from the base of Q1 by this connection being the differential current $I_2 - I_1$.

The current drawn is proportional to the biasing current drawn from the coupled emitters of differential pair transistors Q22 and Q23 and is the PTAT current multiplied by the hyperbolic tangent of the voltage ratio of the voltage difference between the emitters of detection transistor Q0 and second reference transistor Q25, which is not supplied by the RF signal input and does not receive the $V_T \ln(2)$ voltage offset, divided by twice the thermal voltage $V_T$.

Transistors Q11, Q12 and Q21 provide proportional-to-absolute-temperature currents to bias the differential pair of transistors Q22 and Q23 (via the collector of transistor Q21) and to cause the first reference transistor Q1 to offset its emitter voltage by $V_T \cdot \ln(2)$.

Transistors Q2, Q3 and Q24 provide current sources for the detection and first and second reference transistors Q0, Q1 and Q25. Two series resistors R2a/R2b, R3a/R3b and R21a/R21b are provided between the emitters of Q2, Q3 and Q24 to allow tuning of the current source by control of the resistors.

Transistor Q26 configured as a diode ensures a voltage drop between first internal node 210 and second internal node 220, thereby ensuring a voltage difference between the bases of e.g. the detection transistor Q0 and its current source provided by Q3.

The detection transistor Q0 therefore operates according to the voltage level or peak voltage of the RF input signal at VRF. Capacitor C1 ensures that no dc offset from the RF input arrives into the circuit. When the RF input signal is high, i.e. greater than zero, Q0 conducts, causing capacitor C3 to charge up. The capacitance of C3 is chosen to give appropriate degree of hold (i.e. time constant) over the RF input signal cycle between peaks, the particular value desired will depend on the frequency or frequencies of operation. However, it may be assumed that the stored energy of the capacitor ensures that the voltage remains at the peak between cycles subject to any permitted voltage droop.

The detected signal level at Vposdet is measured relative to Vref, obtained from the emitter of first reference transistor Q1. To incorporate the first and second voltage corrections into the detected signal level, two correction currents are supplied to the base of Q1. The first correction current is provided by the proportional-to-absolute-temperature current source from transistor Q12 and generates a voltage correction of $V_T \cdot \ln(2)$. The second correction current is provided from the junction between first PFET mirror PM1 and the NPN mirror NM1. The second correction current is proportional to the hyperbolic tangent function of the detected signal level relative to Vref that would have been obtained in the absence of the first voltage correction, divided by twice the thermal voltage. By judicious choice of component values, the magnitude of the second voltage correction can be chosen to minimize the error between the detected peak voltage level and the peak voltage of the input signal as would be detected by an ideal detector.

The circuit illustrated in FIG. 10 may be implemented in a silicon-germanium process. Other processes that may be suitable for the implementation of detector circuits embodying an aspect of the present disclosure include silicon, germanium, gallium arsenide, indium phosphide, indium gallium arsenide, gallium nitride and indium gallium nitride, although the circuit illustrated in FIG. 10 may require certain process-specific modifications that will be apparent to the skilled reader.

In some semiconductor processes, it may be relatively expensive to include PNP bipolar transistors and it is for this reason that the PFET current mirrors are used in the circuits of FIGS. 10 and 11. Other circuits embodying an aspect of the present disclosure implement some features of the circuit of FIGS. 10 and 11 using PNP bipolar transistors.

While the differential pair of emitter-coupled bipolar transistors provides an efficient means to generate the desired hyperbolic tangent function, other functions may be appropriate if a sigmoid curve, i.e. S-shape, is obtained. Such functions include the logistic function and the error function. An differential pair of FETs does not provide the same hyperbolic tangent function as differential current output but both FETs of the differential pair compete for a share of the biasing current according to their gate voltages, the dc transfer function of the current difference still having a sigmoid curve. Therefore, while the bipolar differential pair implementation may be a preferred feature of a circuit embodying an aspect of the present disclosure, circuits without the bipolar differential pair implementation may nevertheless embody aspects of the present disclosure.

While proportional-to-absolute-temperature current sources are included in the circuit of FIGS. 10 and 11, and such current sources may be advantageous in respect of the temperature variability of the detector circuit, such current sources are not a requirement of circuits embodying aspects of the present disclosure. Other circuits embodying aspects of the present disclosure do not include PTAT current sources or include some but not all of the PTAT current sources of FIGS. 10 and 11.

Certain other features of the circuit of FIGS. 10 and 11 will be apparent to the skilled reader as being non-essential to the detection of a voltage level of an RF input signal according to aspects of this disclosure. Producing the first and second correction voltages between the output nodes may be achieved in other ways that embody aspects of this disclosure. For example, the Meyer correction may be produced by providing to transistor Q1 a current density that is greater than the average current density of the detection transistor Q0, as in the circuits of FIGS. 1 to 3. This may be achieved by varying the sizes or scales of the first and second reference transistors Q1 and Q25 and the detection transistor Q0 with respect to one another, or using transistors in parallel to produce a $V_T \cdot \ln(2)$ correction, or through the drawing of an increased current at the emitter as in the circuits of FIGS. 1 to 3.

While the circuits of FIGS. 10 and 11 provide a differential output, other circuits embodying an aspect of the invention may provide a single-ended output. For example, an additional differential pair may be connected between the Vposdet and Vref output nodes of the circuit of FIG. 10. In some embodiments according to an aspect of the present disclosure, the additional differential pair may be a differential pair with active load. Other embodiments according to an aspect of the present disclosure include the use of an op amp to convert the differential output to a single-ended output.

In some embodiments, circuits of FIGS. 10 and 11, as well as FIGS. 2, 3 and 4, are implemented as integrated circuits on a semiconductor die. This may provide advantages in regularity of device parameters across the die as well as manufacturing advantages. Circuits embodying aspects of the present disclosure may alternatively be implemented using discrete components.

Figure 12:
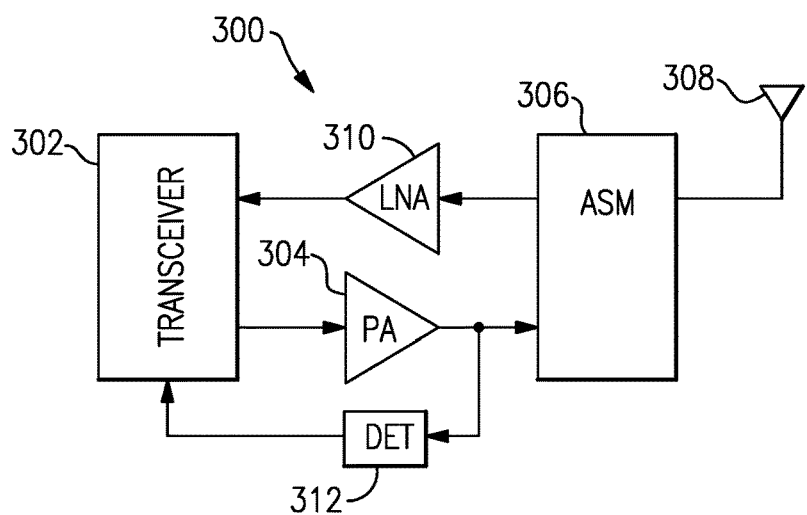
FIG. 12 is a schematic of an RF system including a detector embodying an aspect of the present disclosure.

FIG. 12 schematically depicts an example RF system 300 according to an aspect of the present disclosure, the RF system 300 having a detector 312 implemented to detect power at an output of a PA 304. The PA 304 receives an RF signal to be transmitted from a transceiver 302. The amplified RF signal from the 3A 104 is routed to an antenna 308 through an antenna switching module (ASM) 306. In some embodiments of aspects of the present disclosure, such an amplification configuration is implemented in a wireless local area network (WLAN) PA system.

FIG. 12 further shows that the detector 312 is coupled to the transceiver 302. A control circuit in the transceiver 302 receives an output signal representative of the detected power from the detector 314. Based on such an output signal, the RF signal generated by the transceiver 302 is adjusted appropriately.

Figure 13:
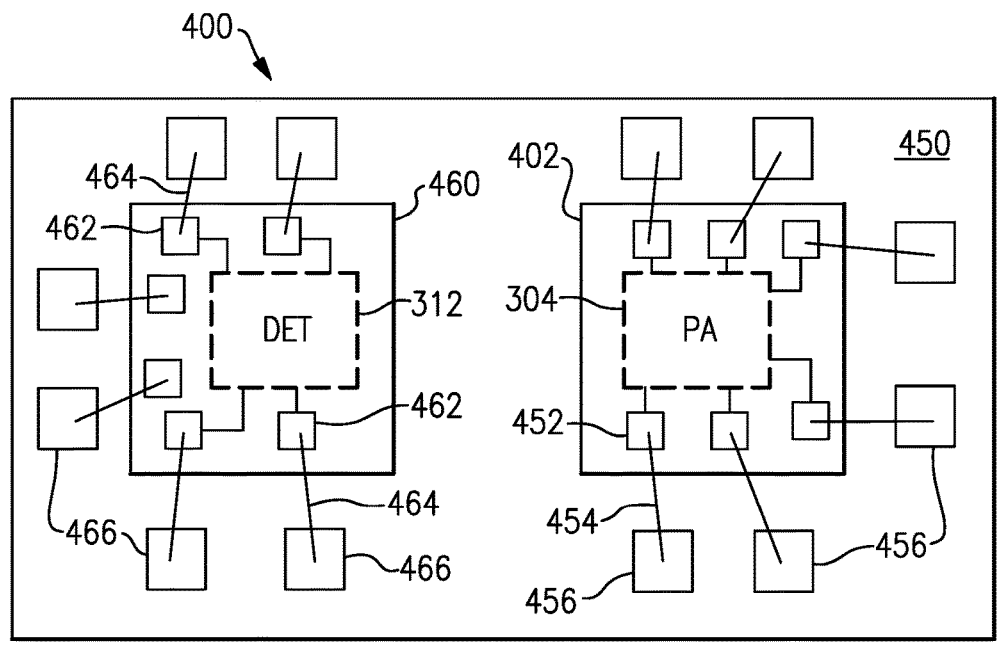
FIG. 13 is a schematic of a first packaged module embodying an aspect of the present disclosure.

FIG. 13 shows an example of a packaged module 400 where a detector 112 having one or more features as described herein is implemented on a die 460 that is separate from a die 402 having a PA 304. In the example of FIG. 6, both of the die 460, 402 are mounted on a packaging substrate 450 that is configured to receive a plurality of components. Such components can include one or more die, such as the example die 460, 402, as well as one or more surface mounted devices (SMDs) such as passive components. In some embodiments, the packaging substrate 450 can include, for example, a laminate substrate.

In the example of FIG. 13, the die 460 includes a plurality of electrical contact pads 462 configured to allow formation of electrical connections 464 such as wirebonds between the die 460 and contact pads 466 formed on the packaging substrate 450. Similarly, the die 402 can include a plurality of electrical contact pads 452 configured to allow formation of electrical connections 454 such as wirebonds between the die 402 and contact pads 456 formed on the packaging substrate 450.

Figure 14:
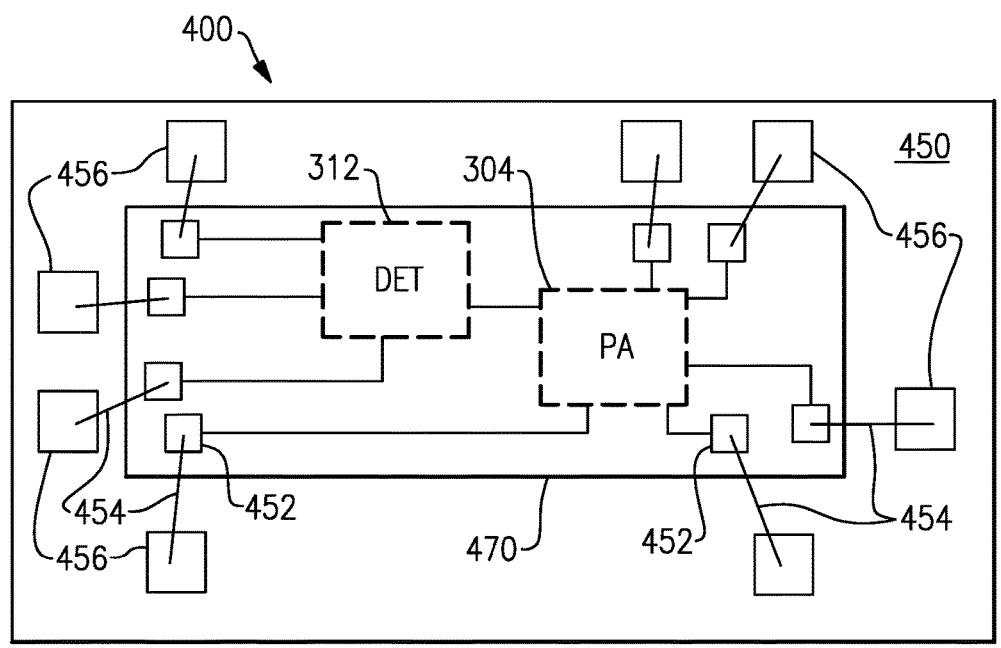
FIG. 14 is a schematic of a second packaged module embodying an aspect of the present disclosure.

FIG. 14 shows an example of a packaged module 400 where a detector 312 having one or more features as described herein is implemented on a die 470 that also includes a PA 304. In the example of FIG. 13, the die 470 is mounted on a packaging substrate 450 that is configured to receive a plurality of components. Such components can include one or more die, such as the example die 470, as well as one or more surface mounted devices (SMDs) such as passive components. In some embodiments, the packaging substrate 450 can include a laminate substrate. In the example of FIG. 14, the die 470 includes a plurality of electrical contact pads 452 configured to allow formation of electrical connections 454 such as wirebonds between the die 470 and contact pads 456 formed on the packaging substrate 450.

In some embodiments, each of the modules 400 of FIGS. 13 and 14 also include one or more packaging structures to, for example, provide protection and facilitate easier handling of the module 400. Such a packaging structure can include an overmold formed over the packaging substrate 450 and dimensioned to substantially encapsulate the various circuits and components implemented on the packaging substrate. It will be understood that although the module 400 is described in the context of wirebond-based electrical connections, one or more features of the present disclosure can also be implemented in other packaging configurations, including flip-chip configurations.

In some embodiments, a die having the PA 304 with its detector 312 is implemented in a packaging configuration that does not necessarily rely on a laminate substrate. For example, such a die can be implemented directly in a QFN type package and not rely on a laminate.

It will also be understood that although the examples of FIGS. 13 and 14 are described in the context of wirebond die, one or more features of the present disclosure can be implemented in other types of die. For example, a flip chip PA die can one or more detectors 314 as described herein.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a base station configured to provide wireless services, a cellular phone, a smart-phone, a hand-held wireless device with or without phone functionality, a wireless tablet, etc.

Figure 15:
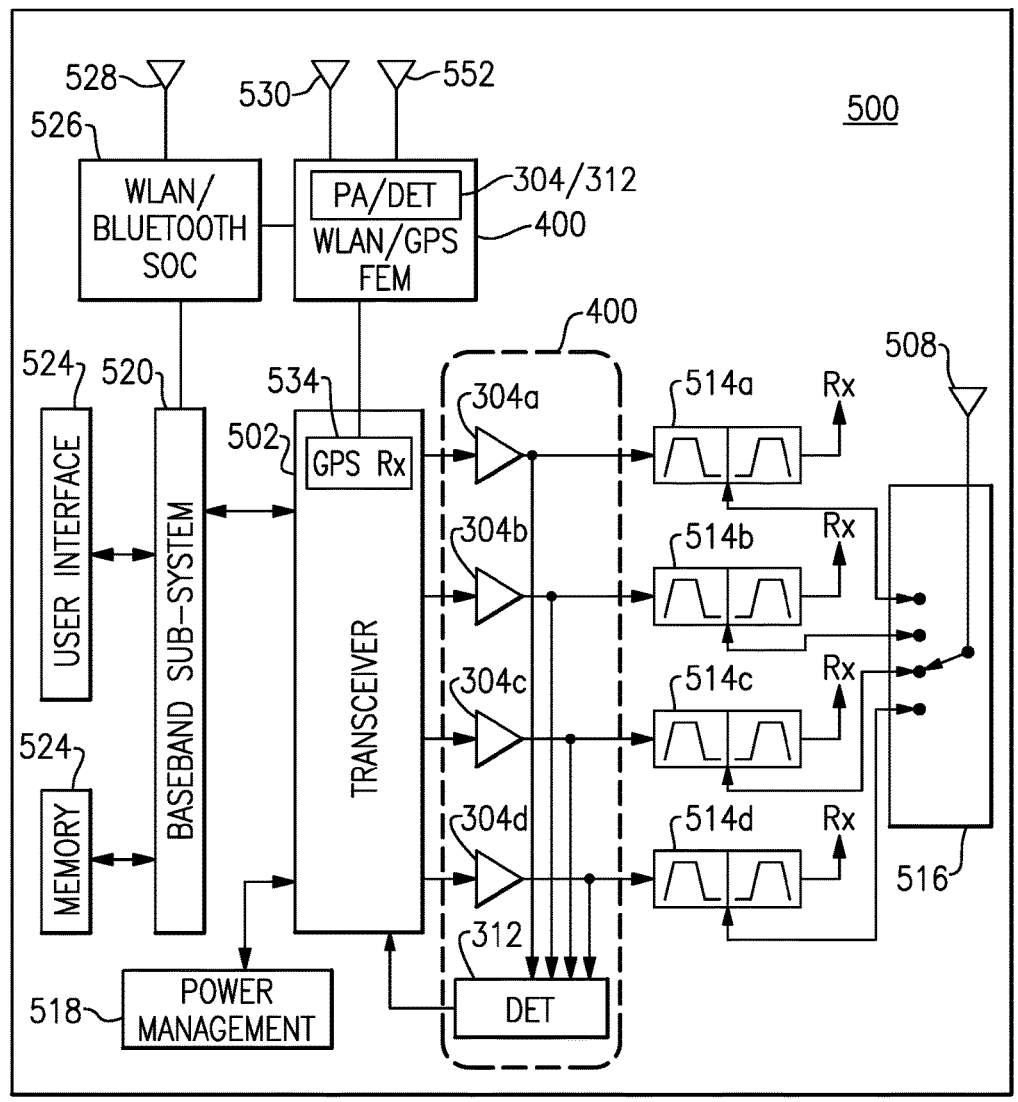
FIG. 15 is a schematic of a wireless device embodying an aspect of the present disclosure.

FIG. 15 schematically depicts an example wireless device 500 according to an aspect of the present disclosure. In the context of various configurations described herein, one or more modules having functionality depicted as 400 can be included in the wireless device 500. As described herein, such a module can include functionality associated with a detector 312 having one or more features as described herein, and functionality associated with a PA 104.

For example, a front-end module (FEM) 200 for WLAN/GPS operations can include a PA 304 and a detector 312 having one or more features as described herein. Such a PA can be configured to amplify a WLAN signal for transmission through an antenna 530. Such a WLAN signal can be generated by a baseband sub-system 520 and routed to the FEM 400 through a WLAN/Bluetooth system-on-chip (SOC) 526.

In the example of FIG. 15, transmission and reception of Bluetooth signals can be facilitated by an antenna 528. In the example shown, GPS functionality can be facilitated by the FEM 400 in communication with a GPS antenna 532 and a GPS receiver 534.

In another example, an RF PA module depicted as 400 can include one or more features as described herein. Such an RF PA module 400 can include one or more bands, and each band can include one or more amplification stages. One or more of such amplification stages can be in communication with one or more detectors (312) and benefit from the compensated power detection techniques as described herein.

In the example wireless device 500, the RF PA module 400 having a plurality of PAs 304a-d can provide an amplified RF signal to a switch 516 (via duplexer 514), and the switch 516 can route the amplified RF signal to an antenna 508. The PA module 400 can receive an unamplified RF signal from a transceiver 502.

The transceiver 502 can also be configured to process received signals. Such received signals can be routed to an LNA (not shown) from the antenna 508, through the duplexer 514. As described herein, the transceiver 502 can also include a controller configured to receive the detected power signal and operate the transceiver 502 accordingly.

The transceiver 502 is shown to interact with a baseband sub-system 520 that is configured to provide conversion between data and/or voice signals suitable for a user and RF signals suitable for the transceiver 502. The transceiver 502 is also shown to be connected to a power management 318 that is configured to manage power for the operation of the wireless device 500. Such a power management component can also control operations of the baseband sub-system 520, as well as other components.

The baseband sub-system 520 is shown to be connected to a user interface 524 to facilitate various input and output of voice and/or data provided to and received from the user. The baseband sub-system 520 can also be connected to a memory 522 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS. Circuits, semiconductor dies and RF modules according to aspects of this disclosure may be incorporated into devices having functionality according to the following non-exhaustive list of standards: Global System for Mobile Communications (GSM), Second Generation (2G), General Packet Radio Services (GPRS), Third Generation (3G), Third Generation Partnership Project (3GPP), Enhanced Data Rates for GSM Evolution (EDGE), Fourth Generation (4G) (Mobile WiMax and LTE) and Wideband Code Division Multiple Access (W-CDMA), among other high band and low band standards. Circuits, semiconductor dies and RF modules according to aspects of this disclosure may also be incorporated into devices having functionality according to IEEE 802.11 specifications for wireless local area network (WLAN) communication.

In interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. In the context of this disclosure, the term "based on" does not mean "based only on," unless expressly specified otherwise. In other words, the term "based on" describes both "based only on" and "based at least on." The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The methods, process and algorithms that have been described may be stored as one or more instructions on a processor-readable or computer-readable medium. The term "computer-readable medium" refers to any available medium that can be accessed by a computer or processor. By way of example, and not limitation, such a medium may comprise RAM, ROM, EEPROM, flash memory, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. In the context of this disclosure, the term "code" may refer to software, instructions, code or data that is/are executable by a computing device or processor.

Software or instructions or data may also be transmitted over a transmission medium. For example, if the software is transmitted from a website, server, or other remote source using a coaxial cable, fibre optic cable, twisted pair, digital subscriber line (DSL), or wireless technologies such as infrared, radio, and microwave, then the coaxial cable, fibre optic cable, twisted pair, DSL, or wireless technologies such as infrared, radio, and microwave are included in the definition of transmission medium.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

The headings provided herein are for convenience only and do not necessarily affect the scope or meaning of the aspects of this the disclosure defined by the claims.

Some embodiments have been described. These embodiments are presented by way of example only and are not intended to limit the scope of the disclosure. Indeed, the novel methods, apparatus and systems described herein may be embodied in a variety of other forms. It should be apparent to those skilled in the art that many more modifications besides those already described are possible without departing from the inventive concepts herein. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A detector circuit for determining a peak voltage level of a radio-frequency signal comprising:
    a detection transistor configured to receive the radio-frequency signal;
    a reference transistor that is not configured to receive the radio-frequency signal; and
    voltage correction circuitry configured to generate a first voltage correction based on a thermal voltage and a second voltage correction based on a voltage difference between a voltage of an emitter of the detection transistor and a voltage of an emitter of the reference transistor.

2. The detector circuit of claim 1 wherein the second voltage correction is based on a voltage difference that is obtained without taking into account the first voltage correction.

3. The detector of claim 1 wherein the second voltage correction increases with increasing voltage difference from zero up to a threshold and does not increase or increases at a lower rate with increasing voltage difference above the threshold.

4. The detector circuit of claim 1 wherein the second voltage correction is based on a sigmoid function of the voltage difference.

5. The detector circuit of claim 4 wherein the second voltage correction is based on a hyperbolic tangent of the voltage difference divided by twice the thermal voltage.

6. The detector circuit of claim 1 comprising first and second reference transistors that are not configured to receive the radio-frequency signal, the second voltage correction being based on a voltage difference between the voltage of the emitter of the detection transistor and a voltage of an emitter of the second reference transistor.

7. The detector circuit of claim 6 wherein the first voltage correction is $V_T \cdot \ln(2)$.

8. The detector circuit of claim 7 wherein the voltage correction circuitry includes a differential pair of transistors for generating the second voltage correction.

9. The detector circuit of claim 8 wherein the voltage correction circuitry includes at least one current mirror stage to mirror a difference in collector or drain currents of the differential pair to the first reference transistor for generation of the second voltage correction.

10. The detector circuit of claim 8 wherein voltage inputs of the differential pair of transistors are coupled to the emitters of the detection transistor and the second reference transistor.

11. The detector circuit of claim 10 wherein the voltage correction circuitry is configured to produce, using the differential pair of transistors, the second voltage correction based on a hyperbolic tangent of the voltage difference between the voltage of the emitter of the detection transistor and the voltage of the emitter of the second reference transistor.

12. The detector circuit of claim 8 wherein the differential pair of transistors includes two emitter-coupled bipolar transistors or two source-coupled field-effect transistors.

13. The detector circuit of claim 12 wherein the differential pair of transistors includes two emitter-coupled bipolar transistors.

14. The detector circuit of claim 13 comprising:
a low-pass RC filter located between the emitter of the detection transistor and a base of a first transistor of the differential pair; and
a matching resistor between the emitter of the second reference transistor and a base of a second transistor of the differential pair.

15. The detector circuit of claim 8 wherein the differential pair of transistors is connected to a proportional-to-absolute-temperature current source.

16. The detector circuit of claim 9 wherein the detection transistor and the first and second reference transistors are connected to proportional-to-absolute-temperature current sources.

17. The detector circuit of claim 9 wherein the detection transistor and the first and second reference transistors are NPN bipolar transistors, the radio-frequency input being provided to a base of the detection transistor.

18. A semiconductor die comprising at least one detector circuit for determining a peak voltage level of a radio-frequency signal comprising:
a detection transistor configured to receive the radio-frequency signal;
a reference transistor that is not configured to receive the radio-frequency signal; and
voltage correction circuitry configured to generate a first voltage correction based on a thermal voltage and a second voltage correction based on a voltage difference between a voltage of an emitter of the detection transistor and a voltage of an emitter of the reference transistor.

19. A wireless device comprising at least one radio-frequency module, the radio-frequency module comprising at least one semiconductor die, the semiconductor die comprising at least one detector circuit for determining a peak voltage level of a radio-frequency signal comprising:
a detection transistor configured to receive the radio-frequency signal;
a reference transistor that is not configured to receive the radio-frequency signal; and
voltage correction circuitry configured to generate a first voltage correction based on a thermal voltage and a second voltage correction based on a voltage difference between a voltage of an emitter of the detection transistor and a voltage of an emitter of the reference transistor.

* * * * *